United States Patent

[11] 3,617,922

[72] Inventor Marvin Bernstein
Asbury Park, N.J.

[21] Appl. No. 41,341
[22] Filed May 28, 1970
[45] Patented Nov. 2, 1971
[73] Assignee The United States of America as represented by the Secretary of the Army

[54] CRYSTAL OSCILLATOR WITH PHASE CONTROL LOOP INCLUDING A CRYSTAL DISCRIMINATOR
5 Claims, 1 Drawing Fig.

[52] U.S. Cl. ........ 331/1, 307/233, 329/117, 331/33
[51] Int. Cl. ........ H03b 3/04, H03d 3/16
[50] Field of Search ........ 331/1, 30, 32, 33; 329/117; 307/233

[56] References Cited
UNITED STATES PATENTS
2,811,639 10/1957 Sontheimer ........ 331/1
2,913,580 11/1959 Kosowsky ........ 329/117

*Primary Examiner*—Roy Lake
*Assistant Examiner*—Siegfried H. Grimm
*Attorneys*—Harry M. Saragovitz, Edward J. Kelly, Herbert Berl and Charles F. Gunderson

ABSTRACT: A crystal oscillator is phase controlled by means of a feedback loop containing a tuned crystal discriminator which supplies a corrective signal to a variable capacitance diode in series with the oscillator crystal.

PATENTED NOV 2 1971

3,617,922

INVENTOR,
MARVIN BERNSTEIN
BY Charles F. Henderson
AGENT
Harry M. Saragovitz,
Edward J. Kelly &
Herbert Berl ATTORNEYS.

CRYSTAL OSCILLATOR WITH PHASE CONTROL LOOP INCLUDING A CRYSTAL DISCRIMINATOR

The invention described herein may be manufactured, used, and licensed by or for the Government for governmental purposes without the payment to me of any royalty thereon.

BACKGROUND OF THE INVENTION

Phase-controlled oscillators are among the most stable of all oscillators and provide the most precise frequency control. The basis for the precision is in the comparison of the output signal of the phase-controlled oscillator with the output signal of an extremely accurate, reference oscillator or signal source of the desired frequency. The signals from the phase-controlled oscillator and the reference oscillator are compared in a discriminator in a well known manner to provide a DC output signal of a strength proportional to the phase shift between the two signals, and of a polarity depending on whether the phase shift is leading or lagging. This DC signal is used to control the frequency of the phase-controlled oscillator to counteract the frequency change that caused the phase shift. The reference oscillator can be more stable, comparatively, than the overall oscillator, since it can have a negligible load and little or no variations in its load. Also, a small, reference oscillator can be very readily adapted to precise crystal control, and it can be more effectively isolated and held under constant ambient conditions than a relatively high power, basic oscillator.

Another simpler version of the phase-controlled oscillator uses a tuned discriminator instead of a separate, reference oscillator to provide the frequency standard as well as the DC output signal for the frequency control of the phase-controlled oscillator. This discriminator may also be relatively stable. It may be precisely made and adjusted and operated under optimum ambient and load conditions. It may be crystal controlled for even greater stability.

This is simpler, but entirely dependent on the stability of a tuned circuit that is subject to drift from changes in temperature, and other ambient conditions, as well as from mechanical changes and ageing. This drift may be caused by any one of the elements in the discriminator, and the more elements involved in the discriminator circuit, the greater the probability of instability or drift. Inductances are normally used in these tuned discriminators, and inductors are particularly prone to change, as well as being relatively bulky and heavy and hard to form on the highly desirable, miniature or integrated circuits in use today. Crystals may be used, but even crystals cannot entirely escape the effects of the instability or drift of the other elements of the circuit.

The phase-controlled oscillator must be of a type whose frequency can be controlled, directly or indirectly, by a DC output signal voltage such as that provided by the comparison of the phase-controlled oscillator output and the reference frequency signals from either the separate, reference oscillator or the tuned, resonant discriminator.

It is therefore an object of this invention to provide an improved, phase-controlled oscillator that uses only fixed values of highly stable capacitors and resistors, and a pair of matched diodes, in a crystal-controlled discriminator to maintain the frequency of the oscillator.

It is a further object of this invention to provide an improved, phase-controlled oscillator with a crystal-controlled, tuned discriminator that does not require inductive elements in its frequency determining network.

SUMMARY OF THE INVENTION

An oscillator circuit includes a crystal that is controlled by a voltage-variable capacitor to provide minor adjustments of frequency. The output of the oscillator is connected to a utilization circuit and also to the input of a highly accurate, highly stable, crystal controlled, phase discriminator to produce a DC output that is a function of the difference in frequency between the AC output of the crystal controlled, resonant circuit of the discriminator and that of the oscillator.

The DC output is connected to the voltage-variable capacitor that controls the basic oscillator to maintain it in phase with the highly stable resonant circuit at the desired frequency.

BRIEF DESCRIPTION OF THE DRAWING

The drawing shows a block and circuit diagram of the essential parts and the connection of elements in a typical embodiment of this invention.

DETAILED DESCRIPTION OF THE PREFERRED EMBODIMENT

Figure 1:
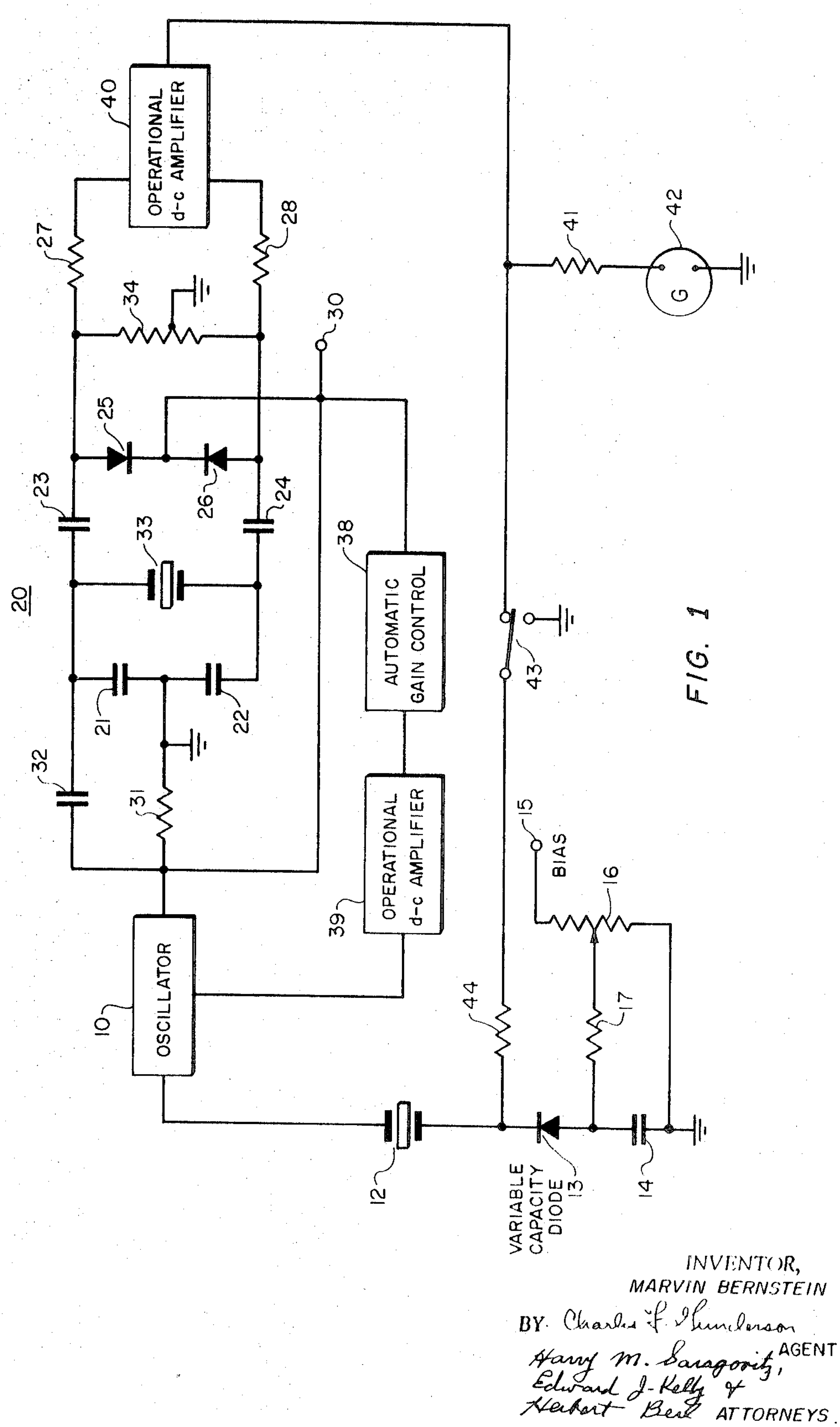

Referring to the drawing, an oscillator 10 is controlled by a crystal 12, which is varied in frequency by a variable-capacity diode 13. A capacitor 14 bypasses the variable-capacity diode to ground. A potential is applied to the variable-capacity diode by a source of bias voltage 15 through voltage dividing and decoupling resistors 16 and 17, respectively.

The output of the oscillator 10 is at terminal 30. This output is also coupled to a frequency-sensitive discriminator 20 through a capacitor 32. The discriminator consists of capacitors 21, 22, 23 and 24; diodes 25 and 26; resistors 27, 28 and 34; and crystal 33. The output of the discriminator is connected to an operational, DC amplifier 40 that is connected to the variable-capacity diode 13 through the switch 43 and resistor 44. A meter 42 is connected to the output of the operational amplifier 40 through resistor 41.

The output of the oscillator 10 is connected across a loading resistor 31. It may also be connected to an automatic gain control system (AGC) 38 with an operational, DC amplifier 39 connected to control the amplitude of the oscillator 10.

In operation, the frequency of the oscillator 10 is determined by the resonant frequency of the crystal 12. This frequency is adjustable, to a limited extent, by the variable capacity of the diode 13 in its electrical circuit. The output of the oscillator is applied to the frequency-sensitive discriminator 20, through the capacitor 32 that has a very high, capacitive reactance with respect to the rest of the circuit. This applies a signal voltage, with an approximately 90 degrees leading phase shift, compared to the alternating current of the oscillator signal, to one side of the crystal 33.

The series-connected capacitors 21 and 22, in parallel with the crystal 33 are a part of its frequency-determining, resonant, electrical circuit. The resonant circuit is energized by the output signal from the oscillator, but the crystal-controlled circuit is resonant at its own frequency, and applies a signal at this frequency, through the capacitors 23 and 24, across the diodes 25 and 26. The diodes are series connected, in opposition, with like poles connected together and directly to the output of the oscillator 10.

As long as the phase relationship between the alternating voltages of the oscillator 10 and the crystal-controlled resonant circuit is constant, the voltages applied, alternately, across the two diodes combine with the voltage, in quadrature phase relationship, applied to the junction of the two diodes to produce equal and opposite voltages across the resistors 27 and 28.

However, as soon as the alternating voltage of the oscillator begins to lead or lag the quadrature condition of the alternating voltage across the crystal-controlled, resonant circuit, a corresponding, positive or negative voltage appears across the resistors 27 and 28 and is applied to the operational, DC amplifier. This positive or negative voltage is amplified as much as necessary in the operational, DC amplifier and is applied through the switch 43 and a decoupling resistor 44 to the variable-capacity diode 13. This varies the resonant frequency of the crystal 12 and of the oscillator 10 to restore the phase relationship between the oscillator signal and the resonant frequency of the crystal-controlled, resonant circuit.

The voltages in the discriminator 20 are normally symmetrical about the ground point between the capacitors 21 and 22 and the center tap of the balancing potentiometer 34. The diodes 25 and 26 should be a matched pair, and the other pairs of elements 21–22, 23–24, and 27–28 should be matched, if possible, but the balancing potentiometer may still be desirable, and should be set, initially, to compensate for any unbalance between the diodes 25 and 26 or the other elements in the circuit.

The resistors 27 and 28 decouple the output signal of the discriminator from the operational, DC amplifier to keep the loading across the discriminator at a minimum, and the "Q" of the crystal-controlled resonant circuit as high as possible.

Resistors 41, 44 and 17 are also decoupling resistors. The resistor 41 decouples the output of the operational, DC amplifier from the meter 42. The resistors 17 and 44 decouple the variable-capacity diode 13 from the DC bias voltage sources.

The meter 42 indicates the presence of a correctional signal in the operational, DC amplifier. This would indicate the functioning of the frequency control system. The meter is also used for the initial adjustment of the circuit. For this initial adjustment the switch 43 is used to short one side of the variable-capacity diode to ground and the frequency of the oscillator 10 is adjusted by varying the bias voltage of the variable-capacity diode by means of the variable tap of the potentiometer 16. The bias is adjusted to bring the output of the oscillator exactly in phase quadrature with the resonant signal across the crystal 33. This reduces the output of the operational amplifier to zero, or to ground potential, which is indicated by a zero reading of the meter. The grounded side of the variable-capacity diode can now be reconnected through switch 43 to the output of the operational amplifier, which is also at ground potential.

The output of the oscillator 10 may also be connected to a conventional AGC circuit indicated by the block 38. This may be connected to a conventional, operational, DC amplifier 39 for any necessary adjustment of the amplitude or the power of the automatic gain control signal. The amplified AGC signal is applied to the oscillator to control the amplitude of the oscillator output signal, in a well-known manner, to maintain a constant amplitude output for any useful load at 30 and for processing by the discriminator 20.

The operational, DC amplifier 40 may be of any well-known type that can amplify the positive or negative signals from the output of the discriminator to the proper range of amplitude and power to vary the capacity of the diode 13 for the necessary correction of the oscillator frequency.

The voltage-controlled, crystal oscillator 10 may be any of several types of oscillators that can be controlled by a crystal that, in turn, can be controlled by a variable-capacity diode, or other voltage-variable reactance. The oscillator should be of a type that can also be amplitude modulated or controlled by an electrical signal, such as that from the operational amplifier 39, to maintain a constant amplitude output signal. A typical oscillator that would be applicable here is described in "State of the Art - Quartz Crystal Units in Oscillators" by E. A. Gerber and R. A. Sykes, Proceedings of the IEEE, Volume 54, No. 2, Feb. 1966, Pgs. 103–116.

In a typical embodiment of this invention, the crystals 12 and 33 have a resonant frequency of 3 megahertz; the variable-capacity diode 13 is a 1N5146; the bias voltage at 15 is −15 volts; the capacitors 14 and 32 are 0.01 microfarad and 10 picrofarads respectively; the capacitors 31 and 22 are 1,000 picrofarads; the capacitors 23 and 24 are 100 picrofarads, and the resistors 27 and 28 are 100,000 ohms. The resistor 31 is 100 ohms; 34 is 50,000 ohms; 41 is 150,000 ohms; 16 is 10,000 ohms; 17 is 10,000 ohms; 44 is 10,000 ohms; and the diodes 25 and 26 are Heulett Packard, hot-carrier types, 2,900.

Obviously many modifications and variations of the present invention are possible in the light of the above teachings. It is therefore to be understood, that within the scope of the appended claims, the invention may be practiced otherwise than as specifically described.

What is claimed is:

1. In combination with a crystal-controlled, voltage-variable oscillator; a discriminator having a resonant circuit comprising a first and a second capacitor connected in series and a discriminator crystal connected in parallel with said first and second, series-connected capacitors; a ground terminal connected to the junction of said series-connected capacitors; a capacitive reactive means connecting the output of said voltage-variable oscillator to one side of said resonant circuit; a pair of diodes connected in series opposition; a third capacitor connecting said one side of said resonant circuit to one side of said series-connected diodes; a fourth capacitor connecting the other side of said resonant circuit to the other side of said series-connected diodes; means for connecting said output of said voltage-variable oscillator to the junction of said series-connected diodes; an operational, DC amplifier having a first and a second input terminal; a first resistor connecting said one side of said series-connected diodes to said first input terminal of said operational, DC amplifier; a second resistor connecting said other side of said series-connected diodes to said second input terminal of said operational, DC amplifier; and means for connecting the output of said operational, DC amplifier to said voltage-variable oscillator to control the frequency of said oscillator.

2. A circuit as in claim 1 having a third resistor connected between said one side and said other side of said series-connected diodes, said third resistor having a variable tap connected to said ground terminal.

3. A circuit as in claim 1 wherein said crystal-controlled, voltage-variable oscillator comprises an oscillator crystal, and a variable-capacity diode; means for connecting said variable-capacity diode to said oscillator crystal to control the resonant frequency of said oscillator crystal; means for connecting said oscillator crystal to said voltage-variable oscillator to control its frequency; means for connecting said output of said operational, DC amplifier to one side of said variable-capacity diode; a source of bias voltage; resistive means for connecting said source of bias voltage to the other side of said variable-capacity diode; and a capacitor connected between said other side of said variable-capacity diode and said ground terminal.

4. A circuit as in claim 3 wherein said means for connecting said output of said operational, DC amplifier to one side of said variable-capacity diode includes an output meter having one terminal connected to said ground terminal; a fourth resistor connecting said output of said operational, DC amplifier to the other terminal of said output meter; a fifth resistor; a switch having a first position connecting said one side of said variable-capacity diode through said fifth resistor to said output of said operational, DC amplifier; said switch having a second position connecting said one side of said variable-capacity diode through said fifth resistor to said ground terminal.

5. In a circuit as in claim 1 wherein said voltage-variable oscillator has an amplitude control terminal; an automatic gain control circuit; means for connecting said output of said voltage-variable oscillator to the input of said automatic gain control circuit and means for connecting the output of said automatic gain control circuit to said amplitude control terminal of said voltage-variable oscillator to maintain a constant voltage amplitude of the output signal.

* * * * *